(12) United States Patent
Huang et al.

(10) Patent No.: US 10,818,653 B2
(45) Date of Patent: Oct. 27, 2020

(54) CONTROL CIRCUIT AND OPERATING CIRCUIT UTILIZING THE SAME

(71) Applicant: Vanguard International Semiconductor Corporation, Hsinchu (TW)

(72) Inventors: Shao-Chang Huang, Hsinchu (TW); Shang-Chuan Pai, Changhua (TW); Wei-Chung Wu, Kaohsiung (TW); Szu-Chi Chen, Jhudong Township (TW); Sheng-Chih Chuang, Pingtung (TW); Yin-Ting Lin, Kaohsiung (TW); Pei-Chun Yu, Hsinchu (TW); Han-Pei Liu, Hsinchu (TW); Jung-Tsun Chuang, Tainan (TW); Chieh-Yao Chuang, Kaohsiung (TW); Hung-Wei Chen, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/839,197

(22) Filed: Dec. 12, 2017

(65) Prior Publication Data

US 2019/0181135 A1  Jun. 13, 2019

(51) Int. Cl.
*H01L 27/02* (2006.01)
*H02H 9/04* (2006.01)
*H01L 27/092* (2006.01)

(52) U.S. Cl.
CPC ...... *H01L 27/0288* (2013.01); *H01L 27/0266* (2013.01); *H01L 27/092* (2013.01); *H02H 9/046* (2013.01)

(58) Field of Classification Search
CPC ............... H01L 27/0288; H01L 27/092; H01L 27/0266; H02H 9/046

(Continued)

(56) References Cited

U.S. PATENT DOCUMENTS 6,069,782 A * 5/2000 Lien ..................... H01L 27/0248
361/111
2002/0167054 A1* 11/2002 Chang ................. H01L 27/0266
257/360

(Continued)

FOREIGN PATENT DOCUMENTS

CN           1755930 A        4/2006

OTHER PUBLICATIONS

Chinese Office Action and Search Report, dated Sep. 19, 2019, for Chinese Application No. 201710878261.7.

(Continued)

*Primary Examiner* — Mohammad M Hoque
(74) *Attorney, Agent, or Firm* — Birch, Stewart, Kolasch & Birch, LLP

(57) ABSTRACT

A control circuit providing an output voltage and including an N-type transistor, a first P-type transistor and a second P-type transistor is provided. The N-type transistor is coupled to a first power terminal. The first P-type transistor includes a first source, a first drain, a first gate and a first bulk. The first gate is coupled to a gate of the N-type transistor. The first bulk is coupled to the first source. The second P-type transistor includes a second source, a second drain, a second gate and a second bulk. The second source is coupled to a second power terminal. The second drain and the second bulk are coupled to the first bulk.

18 Claims, 5 Drawing Sheets

(58) Field of Classification Search
USPC .......................................................... 257/659
See application file for complete search history.

(56) References Cited

U.S. PATENT DOCUMENTS

| | | | |
|---|---|---|---|
| 2004/0257728 A1* | 12/2004 | Hu ...................... | H01L 27/0266 |
| | | | 361/56 |
| 2009/0315118 A1* | 12/2009 | Yu ........................ | H03K 17/063 |
| | | | 257/369 |
| 2011/0193615 A1 | 8/2011 | Ono | |
| 2012/0154962 A1* | 6/2012 | Russ ...................... | H02H 9/046 |
| | | | 361/56 |
| 2013/0077196 A1* | 3/2013 | Ali ................... | H03K 19/00384 |
| | | | 361/56 |
| 2016/0173081 A1* | 6/2016 | Pan .................. | H03K 19/01852 |
| | | | 361/56 |
| 2017/0104483 A1* | 4/2017 | Zeng ...................... | H03K 19/20 |

OTHER PUBLICATIONS

Taiwanese Office Action, dated Mar. 8, 2018, for Taiwanese Application No. 106132081.

* cited by examiner

CONTROL CIRCUIT AND OPERATING CIRCUIT UTILIZING THE SAME

BACKGROUND OF THE INVENTION

Field of the Invention

The invention relates to a control circuit, and more particularly to a control circuit which is not easily damaged by electrostatic discharge (ESD) current.

Description of the Related Art

As the process of manufacturing semiconductors develops, ESD protection has become one of the most critical reliability issues for integrated circuits (IC). In particular, as semiconductor processes advance into the deep sub-micron stage, scaled-down devices and thinner gate oxides are more vulnerable in view of ESD stress. Generally, input/output pads on IC chips are required to sustain at least 2 kVolt ESD stress of high Human Body Mode (HBM) or 200 Volt of Machine Mode. Thus, the input/output pads on IC chips are usually designed to include ESD protect devices or circuits for protecting the core circuit in IC chips from ESD damage. However, when an ESD event occurs and the ESD voltage is not enough to trigger an ESD protection element, the ESD voltage will damage the internal core circuits.

BRIEF SUMMARY OF THE INVENTION

In accordance with an embodiment, a control circuit provides an output voltage and comprises an N-type transistor, a first P-type transistor and a second P-type transistor. The N-type transistor is coupled to a first power terminal. The first P-type transistor comprises a first source, a first drain, a first gate and a first bulk. The first gate is coupled to a gate of the N-type transistor. The first bulk is coupled to the first source. The second P-type transistor comprises a second source, a second drain, a second gate and a second bulk. The second source is coupled to a second power terminal. The second drain and the second bulk are coupled to the first bulk.

In accordance with another embodiment, an operating circuit comprises an electrostatic discharge (ESD) protection element and a control circuit. The ESD protection element is coupled between a first power terminal and a second power terminal. The control circuit is configured to provide an output voltage and comprises an N-type transistor, a first P-type transistor and a second P-type transistor. The N-type transistor is coupled to the first power terminal. The first P-type transistor comprises a first source, a first drain, a first gate and a first bulk. The first gate is coupled to a gate of the N-type transistor. The first bulk is coupled to the first source. The second P-type transistor comprises a second source, a second drain, a second gate and a second bulk. The second source is coupled to the second power terminal. The second drain and the second bulk are coupled to the first bulk.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
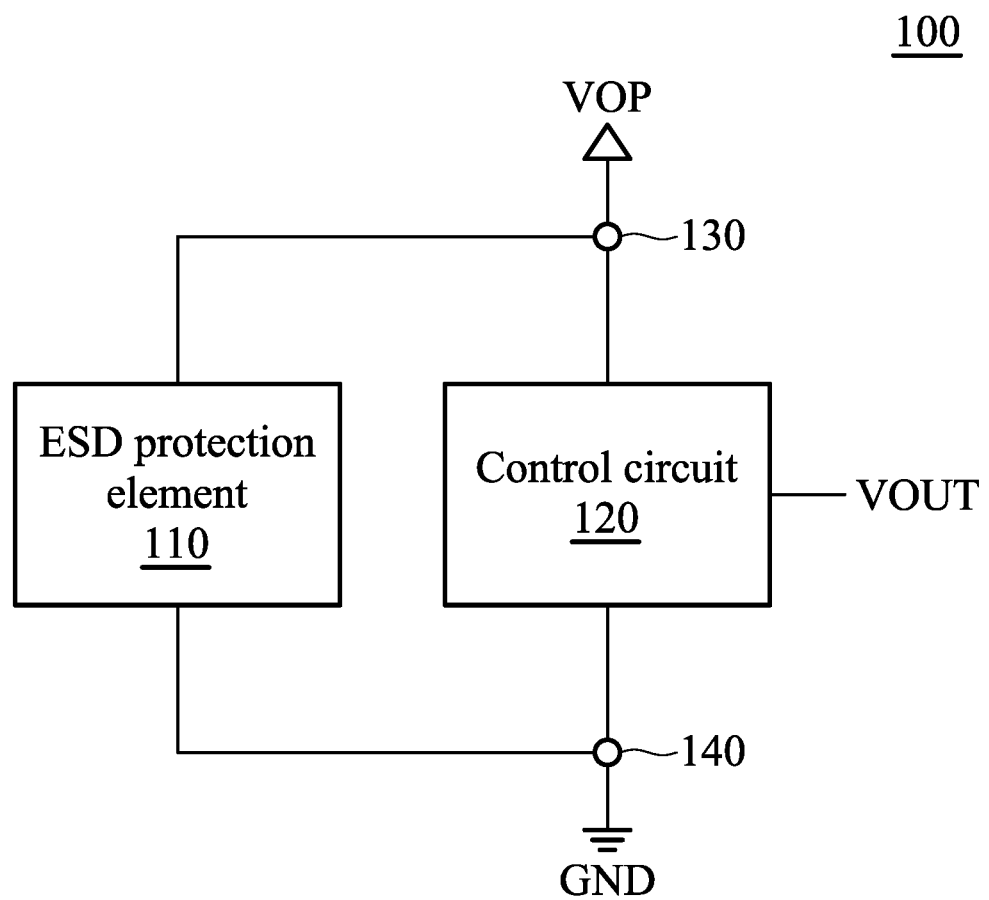
FIG. 1 is a schematic diagram of an exemplary embodiment of an operating circuit, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operating circuit, according to various aspects of the present disclosure. The operating circuit 100 comprises an electrostatic discharge (ESD) protection element 110 and a control circuit 120. The ESD protection element 110 is coupled between power terminals 130 and 140. When the voltage difference between the power terminals 130 and 140 reaches a predetermined value, it means that an ESD event occurs. Therefore, the operating circuit 100 enters a protection mode. In the protection mode, the ESD protection element 110 operates to release an ESD current from the power terminal 130 to the power terminal 140 or release the ESD current from the power terminal 140 to the power terminal 130. The invention does not limit the kind of the ESD protection element 110. Any element can serve as the ESD protection element 110, as long as the element is capable of accepting high voltage.

The control circuit 120 is coupled between the power terminals 130 and 140 to provide an output voltage VOUT. For example, when the power terminal 130 receives an operation voltage VOP and the power terminal 140 receives a ground voltage GND, the operating circuit 100 enters a normal mode. In the normal mode, the control circuit 120 operates to generate the output voltage VOUT.

The invention does not limit the circuit structure of the control circuit 120. In one embodiment, the control circuit 120 is a tie-high circuit. The tie-high circuit generates an output voltage VOUT that is higher than the ground voltage GND. In one embodiment, the output voltage VOUT may be equal to or less than the operation voltage VOP. In another embodiment, the control circuit 120 is a tie-low circuit. The tie-low circuit generates an output voltage VOUT that is lower than the operation voltage VOP. In one embodiment, the output voltage VOUT may be equal to the ground voltage GND.

Figure 2:
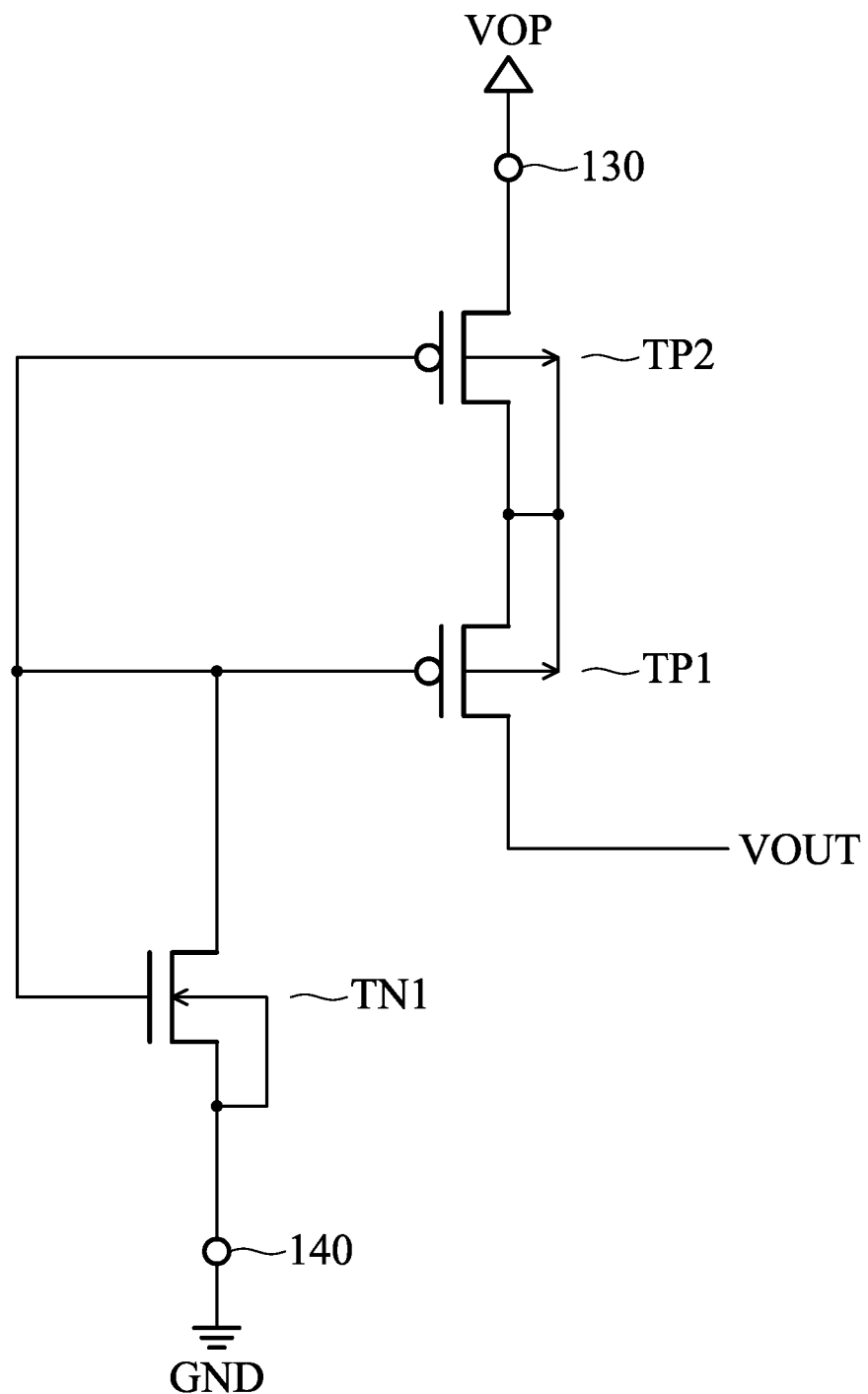
FIG. 2 is a schematic diagram of an exemplary embodiment of a control circuit, according to various aspects of the present disclosure.

FIG. 2 is a schematic diagram of an exemplary embodiment of a control circuit, according to various aspects of the present disclosure. In this embodiment, the control circuit 200 is a tie-high circuit, which generates an output voltage VOUT that is higher than the ground voltage GND. In one embodiment, the output voltage VOUT is equal to or less than the operation voltage VOP. As shown in FIG. 2, the control circuit 200 comprises P-type transistors TP1 and TP2 and an N-type transistor TN1.

The source of the P-type transistor TP2 is coupled to the power terminal 130 to receive the operation voltage VOP. The gate of the P-type transistor TP2 is coupled to the gate of the P-type transistor TP1, the gate of the N-type transistor TN1 and the drain of the N-type transistor TN1. The bulk and the drain of the P-type transistor TP2 are coupled to the bulk and the source of the P-type transistor TP1. The voltage of the drain of the P-type transistor TP1 serves as the output voltage VOUT. The bulk and the source of the N-type transistor TN1 are coupled to the power terminal 140 to receive the ground voltage GND.

When the power terminal 130 receives the operation voltage VOP and the power terminal 140 receives the ground voltage GND, the control circuit 200 operates in a normal mode. In this mod, the P-type transistors TP1 and TP2 are turned on and the N-type transistor TN1 is turned off. Therefore, the output voltage VOUT is at a high level. However, when the voltage difference between the power terminals 130 and 140 is higher than a predetermined value, it means that an ESD event occurs between the power terminals 130 and 140. Therefore, the control circuit 200 enters a protection mode. In the protection mode, since the bulks of the P-type transistors TP1 and TP2 are not coupled to the power terminal 130, the P-type transistors TP1 and TP2 and the N-type transistor TN1 are not turned on. Since an ESD protection (e.g. 110) disposed outside of the control circuit 200 is turned on, an ESD current is released from the power terminal 130 to the power terminal 140 or from the power terminal 140 to the power terminal 130. Therefore, the control circuit 200 is not damaged by the ESD current.

Figure 3:
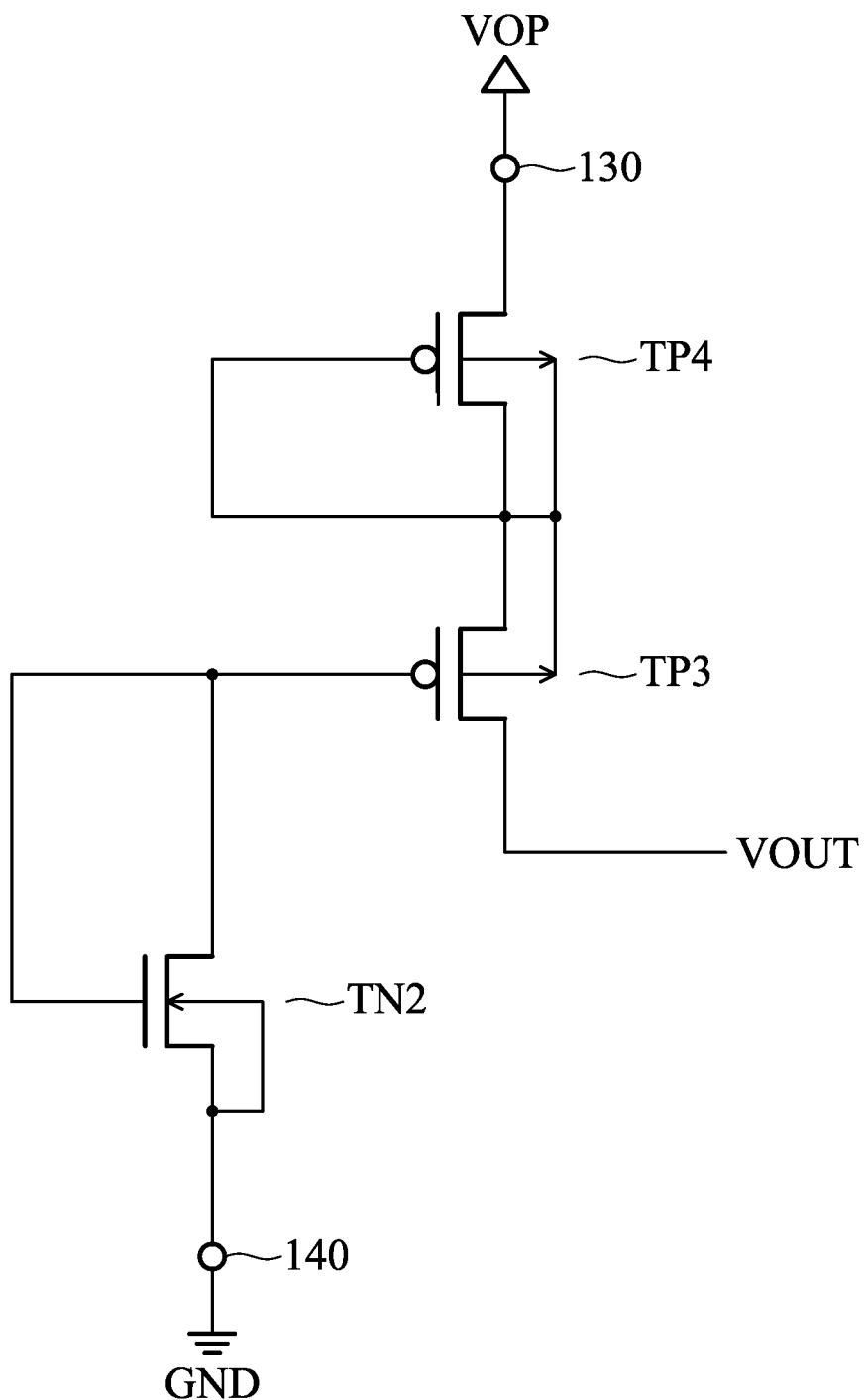
FIG. 3 is a schematic diagram of another exemplary embodiment of the control circuit, according to various aspects of the present disclosure.

FIG. 3 is a schematic diagram of another exemplary embodiment of the control circuit, according to various aspects of the present disclosure. In this embodiment, the control circuit 300 is a tie-high circuit which generates an output voltage VOUT that is higher than the ground voltage GND. In one embodiment, the output voltage VOUT is equal to or less than the operation voltage VOP. As shown in FIG. 3, the control circuit 300 comprises P-type transistors TP3 and TP4 and an N-type transistor TN2.

The source of the P-type transistor TP4 is coupled to the power terminal 130 to receive the operation voltage VOP. The gate, the drain and the bulk of the P-type transistor TP4 are coupled to the source and the bulk of the P-type transistor TP3. The voltage of the drain of the P-type transistor TP3 is provided as the output voltage VOUT. The gate of the P-type transistor TP3 is coupled to the gate and the drain of the N-type transistor TN2. The bulk and the source of the N-type transistor TN2 are coupled to the power terminal 140 to receive the ground voltage GND.

When the power terminal 130 receives the operation voltage VOP and the power terminal 140 receives the ground voltage GND, the control circuit 300 operates in a normal mode. In the normal mode, the P-type transistors TP3 and TP4 are turned on and the N-type transistor TN2 is turned off. Therefore, the output voltage VOUT is at a high level. However, when the voltage difference between the power terminals 130 and 140 is higher than a predetermined value, it means that an ESD event occurs between the power terminals 130 and 140. Therefore, the control circuit 300 enters a protection mode. In this mode, since the bulks of the P-type transistors TP3 and TP4 are coupled to the gate and the drain of the P-type transistor TP4, it is ensured that the P-type transistors TP3 and TP4 and the N-type transistor TN2 are turned off. Since an ESD protection element (e.g. 110) is turned on, an ESD current is released from the power terminal 130 to the power terminal 140 or from the power terminal 140 to the power terminal 130. Therefore, the control circuit 300 does not get damaged by the ESD current.

Figure 4:
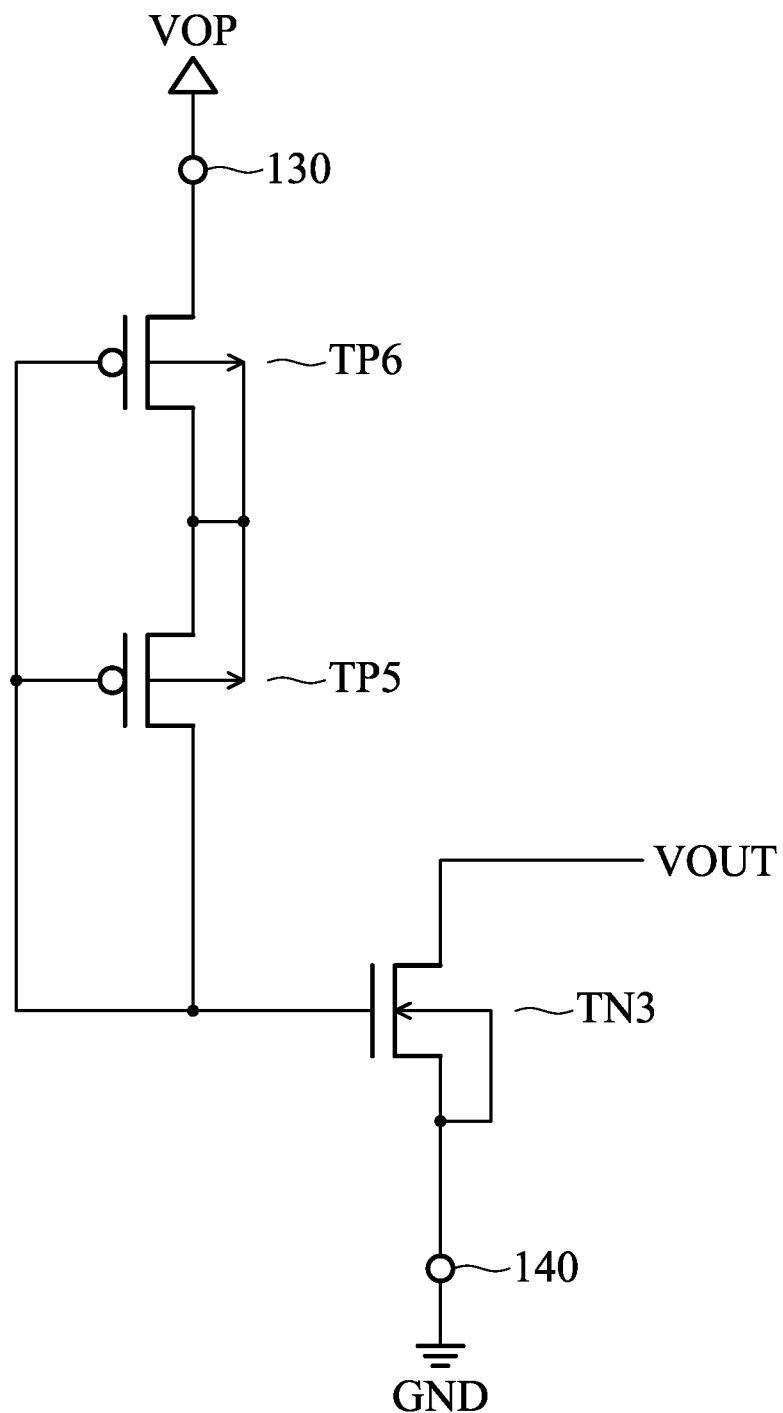
FIG. 4 is a schematic diagram of another exemplary embodiment of the control circuit, according to various aspects of the present disclosure.

FIG. 4 is a schematic diagram of another exemplary embodiment of the control circuit, according to various aspects of the present disclosure. In this embodiment, the control circuit 400 is a tie-low circuit, which generates an output voltage VOUT less than the operation voltage VOP. In one embodiment, the output voltage VOUT is equal to the ground voltage GND. As shown in FIG. 4, the control circuit 400 comprises P-type transistors TP5 and TP6 and an N-type transistor TN3.

The source of the P-type transistor TP6 is coupled to the power terminal 130 to receive the operation voltage VOP. The gate of the P-type transistor TP6 is coupled to the gate of the P-type transistor TP5 and the gate of the N-type transistor TN3. The bulk and the drain of the P-type transistor TP6 are coupled to the bulk and the source of the P-type transistor TP5. The drain of the P-type transistor TP5 is coupled to the gate of the N-type transistor TN3. The voltage of the drain of the N-type transistor TN3 is provided as the output voltage VOUT. The bulk and the source of the N-type transistor TN3 are coupled to the power terminal 140 to receive the ground voltage GND.

When the power terminal 130 receives the operation voltage VOP and the power terminal 140 receives the ground voltage GND, the control circuit 400 operates in a normal mode. In the normal mode, the P-type transistors TP5 and TP6 are turned off and the N-type transistor TN3 is turned on. Therefore, the output voltage VOUT is at a low level. However, when the voltage difference between the power terminals 130 and 140 is higher than a predetermined value, it means that an ESD event occurs between the power terminals 130 and 140. Therefore, the control circuit 400 operates in a protection mode. In the protection mode, since the bulks of the P-type transistors TP5 and TP6 are coupled to the drain of the P-type transistor TP6, the P-type transistors TP5 and TP6 and the N-type transistor TN3 are turned off. In the protection mode, an ESD protection element (e.g. 110) is turned on, an ESD current is released from the power terminal 130 to the power terminal 140 or released from the power terminal 140 to the power terminal 130. Therefore, the control circuit 400 does not damaged by the ESD current.

Figure 5:
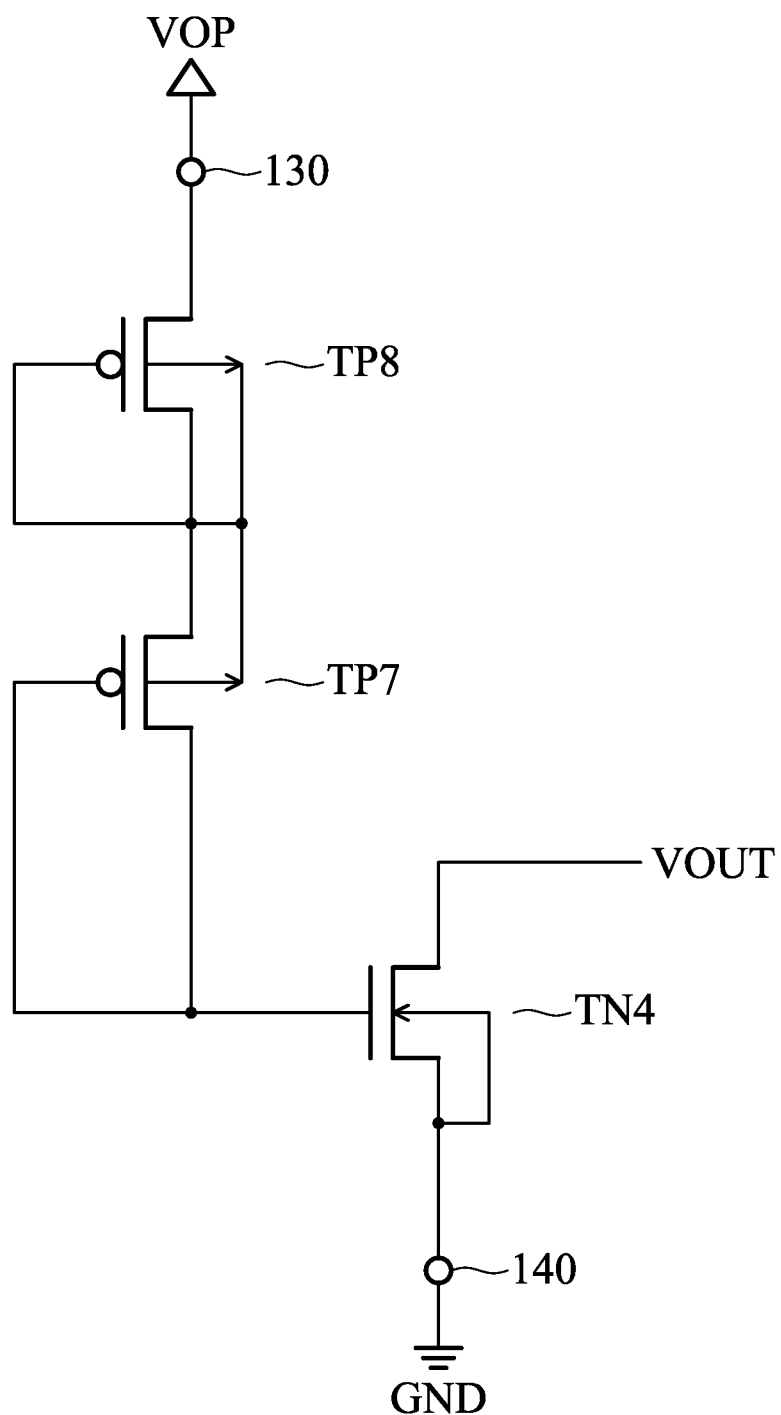
FIG. 5 is a schematic diagram of another exemplary embodiment of the control circuit, according to various aspects of the present disclosure.

FIG. 5 is a schematic diagram of another exemplary embodiment of the control circuit, according to various aspects of the present disclosure. In this embodiment, the control circuit 500 is a tie-low circuit to generate an output voltage VOUT less than the operation voltage VOP. In one embodiment, the operation voltage VOP is equal to the ground voltage GND. As shown in FIG. 5, the control circuit 500 comprises P-type transistors TP7 and TP8 and an N-type transistor TN4.

The source of the P-type transistor TP8 is coupled to the power terminal 130 to receive the operation voltage VOP. The gate, the drain and the bulk of the P-type transistor TP8 are coupled to the source and the bulk of the P-type transistor TP7. The gate and the drain of the P-type transistor TP7 are coupled to the gate of the N-type transistor TN4. The voltage of the drain of the N-type transistor TN4 serves as the output voltage VOUT. The bulk and the source of the N-type transistor TN4 are coupled to the power terminal 140 to receive the ground voltage GND.

When the power terminal 130 receives the operation voltage VOP and the power terminal 140 receives the ground voltage GND, the control circuit 500 operates in a normal mode. In this mode, the P-type transistors TP7 and TP8 are turned off and the N-type transistor TN4 is turned on. Therefore, the output voltage VOUT is at a low level. However, when the voltage difference between the power terminals 130 and 140 is higher than a predetermined value, it means that an ESD event occurs between the power terminals 130 and 140. Therefore, the control circuit 500 enters a protection mode. In the protection mode, since the bulks of the P-type transistors TP7 and TP8 are coupled to the gate of the P-type transistor TP8, it is ensured that the P-type transistors TP7 and TP8 and the N-type transistor TN4 are turned off. Since an ESD protection circuit (e.g. 110) is turned on, an ESD current is released from the power terminal 130 to the power terminal 140 or from the power terminal 140 to the power terminal 130. Therefore, the control circuit 500 does not get damaged by the ESD current.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A control circuit providing an output voltage and comprising:
   an N-type transistor directly connected to a first power terminal;
   a first P-type transistor comprising a first source, a first drain, a first gate and a first bulk, wherein the first gate is directly connected to a gate of the N-type transistor, and the first bulk is directly connected to the first source; and
   a second P-type transistor comprising a second source, a second drain, a second gate and a second bulk, wherein the second source is directly connected to a second power terminal, and the second drain and the second bulk are directly connected to the first bulk,
   wherein the second gate is directly connected to the first gate,
   wherein in response to the voltage difference between the first power terminal and the second power terminal being higher than a predetermined value, the N-type transistor, the first P-type transistor, and the second P-type transistor are not turned on,
   wherein in response to the second power terminal receiving an operation voltage and the first power terminal receiving a ground voltage, the first P-type transistor and the second P-type transistor are turned on and the N-type transistor is turned off.

2. The control circuit as claimed in claim 1, wherein the second gate is coupled to the drain of the N-type transistor.

3. The control circuit as claimed in claim 2, wherein a voltage of the first drain serves as the output voltage.

4. The control circuit as claimed in claim 1, wherein the first drain is coupled to the gate of the N-type transistor.

5. The control circuit as claimed in claim 4, wherein a voltage of a drain of the N-type transistor serves as the output voltage.

6. The control circuit as claimed in claim 1, wherein the second gate is coupled to the second drain.

7. The control circuit as claimed in claim 6, wherein the first gate is coupled to a drain of the N-type transistor.

8. The control circuit as claimed in claim 7, wherein a voltage of the first drain is the output voltage.

9. The control circuit as claimed in claim 6, wherein the first gate is coupled to the first drain.

10. The control circuit as claimed in claim 9, wherein a voltage of a drain of the N-type transistor serves as the output voltage.

11. An operating circuit comprising:
    an electrostatic discharge (ESD) protection element coupled between a first power terminal and a second power terminal; and
    a control circuit configured to provide an output voltage and comprising:
    an N-type transistor directly connected to the first power terminal;
    a first P-type transistor comprising a first source, a first drain, a first gate and a first bulk, wherein the first gate is directly connected to a gate of the N-type transistor, and the first bulk is directly connected to the first source; and
    a second P-type transistor comprising a second source, a second drain, a second gate and a second bulk, wherein the second source is directly connected to the second power terminal, and the second drain and the second bulk are directly connected to the first bulk,
    wherein the second gate is directly connected to the first gate,
    wherein in response to the voltage difference between the first power terminal and the second power terminal being higher than a predetermined value, the N-type transistor, the first P-type transistor, and the second P-type transistor are not turned on, and
    wherein in response to the second power terminal receiving an operation voltage and the first power terminal receiving a ground voltage, the first P-type transistor and the second P-type transistor are turned on and the N-type transistor is turned off.

12. The operating circuit as claimed in claim 11, wherein when a voltage difference between the first and second power terminals reaches a predetermined value, the ESD protection element is turned on to release an ESD current from the first power terminal to the second power terminal or to release the ESD current from the second power terminal to the first power terminal.

13. The operating circuit as claimed in claim 12, wherein when the ESD protection element is turned on, the first P-type transistor, the second P-type transistor and the N-type transistor are turned off, and when at least one of the first P-type transistor, the second P-type transistor and the N-type transistor is turned on, the ESD protection element is turned off.

14. The operating circuit as claimed in claim 11, wherein the second gate is coupled to a drain of the N-type transistor, and a voltage of the first drain is provided as the output voltage.

15. The operating circuit as claimed in claim 11, wherein the first drain is coupled to the gate of the N-type transistor, and a voltage of a drain of the N-type transistor serves as the output voltage.

16. The operating circuit as claimed in claim 11, wherein the second gate is coupled to the second drain.

17. The operating circuit as claimed in claim 16, wherein the first gate is coupled to a drain of the N-type transistor, and a voltage of the first drain is the output voltage.

18. The operating circuit as claimed in claim 16, wherein the first gate is coupled to the first drain, and a voltage of a drain of the N-type transistor is provided as the output voltage.

* * * * *